(12) United States Patent
Kato et al.

(10) Patent No.: US 9,166,127 B2
(45) Date of Patent: Oct. 20, 2015

(54) LIGHT SOURCE MODULE

(75) Inventors: Takuma Kato, Tokyo (JP); Masatoshi Kawamata, Tokyo (JP)

(73) Assignee: Koha Co., Ltd., Tokyo (JP)

( * ) Notice: Subject to any disclaimer, the term of this patent is extended or adjusted under 35 U.S.C. 154(b) by 540 days.

(21) Appl. No.: 13/138,753

(22) PCT Filed: Feb. 25, 2010

(86) PCT No.: PCT/JP2010/052921
§ 371 (c)(1),
(2), (4) Date: Nov. 28, 2011

(87) PCT Pub. No.: WO2010/113575
PCT Pub. Date: Oct. 7, 2010

(65) Prior Publication Data
US 2012/0081907 A1 Apr. 5, 2012

(30) Foreign Application Priority Data
Mar. 31, 2009 (JP) .................. 2009-087031

(51) Int. Cl.
*F21V 8/00* (2006.01)
*H01L 33/58* (2010.01)
(Continued)

(52) U.S. Cl.
CPC ............. *H01L 33/58* (2013.01); *G02B 5/0242* (2013.01); *G02B 5/0278* (2013.01); *G02B 19/0028* (2013.01); *G02B 19/0061* (2013.01); *G02B 19/0071* (2013.01); *F21V 5/04* (2013.01); *F21V 7/0091* (2013.01); *F21Y 2101/02* (2013.01);
(Continued)

(58) Field of Classification Search
CPC ......... F21V 5/046; F21V 7/0066; F21V 7/09; F21V 7/0091; G02B 19/0028; G02B 19/0061
USPC .................. 362/97.3, 311.06, 308, 311.01
See application file for complete search history.

(56) References Cited

U.S. PATENT DOCUMENTS 6,290,364 B1 * 9/2001 Koike et al. .................... 362/620
6,598,998 B2 * 7/2003 West et al. ..................... 362/307
(Continued)

FOREIGN PATENT DOCUMENTS

JP     H 7-209502 A    8/1995
JP     H 11-323120 A   11/1999
(Continued)

OTHER PUBLICATIONS

International Search Report (ISR) (PCT Form PCT/ISA/210) in PCT/JP2010/052921 dated Mar. 30, 2010.
(Continued)

*Primary Examiner* — Sharon Payne
(74) *Attorney, Agent, or Firm* — McGinn IP Law Group, PLLC (57) ABSTRACT

Disclosed is a light source module which does not require rigorous adjustments of the light direction and is free from luminance unevenness. Specifically disclosed is a light source module (1) which comprises a light-emitting element (40), and a light direction changing element (10) which is composed of a transparent resin and discharges the light emitted from the light-emitting element (40) toward the lateral direction. The light direction changing element (10) contains not less than 0.01% by weight but not more than 0.1% by weight of a light-diffusing agent (14) per 100% by weight of the transparent resin.

11 Claims, 5 Drawing Sheets

(51) Int. Cl.

| | | |
|---|---|---|
| *G02B 5/02* | (2006.01) | |
| *G02B 19/00* | (2006.01) | |
| *F21V 5/04* | (2006.01) | |
| *F21V 7/00* | (2006.01) | |
| *F21Y 101/02* | (2006.01) | |
| *G09F 13/04* | (2006.01) | |
| *H01L 33/48* | (2010.01) | |

(52) U.S. Cl.
CPC ....... *G09F 2013/0422* (2013.01); *H01L 33/483* (2013.01); *H01L 2933/0083* (2013.01)

(56) References Cited

U.S. PATENT DOCUMENTS

| | | | |
|---|---|---|---|
| 6,607,286 B2 | 8/2003 | West et al. | |
| 7,438,445 B2 * | 10/2008 | Shiau et al. | ............. 362/333 |
| 7,768,592 B2 * | 8/2010 | Hong | ............. 349/64 |

FOREIGN PATENT DOCUMENTS

| | | | |
|---|---|---|---|
| JP | 2001-077427 | A | 3/2001 |
| JP | 2003-8068 | A | 1/2003 |
| JP | 2006-208582 | A | 8/2006 |
| JP | 2006-260003 | A | 9/2006 |
| JP | 2007-48883 | A | 2/2007 |
| JP | 2007-227590 | A | 9/2007 |
| JP | 2007-227791 | A | 9/2007 |
| JP | 2008-159394 | A | 7/2008 |
| WO | WO 2008/007492 | A1 | 1/2008 |
| WO | WO 2008/015887 | A1 | 2/2008 |

OTHER PUBLICATIONS

Japanese Office Action dated Aug. 27, 2013, with partial English translation.
Japanese Office Action dated Jan. 28, 2014, with partial English translation.
Japanese Office Action dated Mar. 24, 2015 with an English translation.
Trial Decision dated May 12, 2015, with a partial English translation.

* cited by examiner

LIGHT SOURCE MODULE

TECHNICAL FIELD

The present invention relates to a light source module used for a light source of a backlight of illuminated sign and liquid crystal display or a lighting equipment, etc., and in particular, to a light source module which prevents a decrease in luminance or luminance uniformity.

BACKGROUND ART

Conventionally, an incandescent bulb or a fluorescent lamp is used as a light source of, e.g., a backlight of illuminated sign and liquid crystal display or a lighting equipment, etc. In recent years, since it has become possible to output high power from a light-emitting diode (LED) which is a point light source and a desired intensity of illumination usable for lighting can be obtained, the LED is frequently used as a light source instead of incandescent bulbs or fluorescent lamps.

Unlike a surface light source such as a fluorescent lamp, etc., the LED has a small light-emitting area and the direct light of the LED is too bright for human eyes when looking directly thereat. It is necessary to arrange plural LEDs so that use of direct light of LED does not cause brightness unevenness when used for illumination which requires surface light emission, such as for illuminated signs.

An example in which this type of LED is used for illumination includes, e.g., an LED package which causes LEDs to illuminate uniform surface light (see, e.g., Patent document 1). In the conventional LED package described in Patent document 1, lenses having a funnel-shaped portion on the upper surface thereof and a sawtooth-shaped portion on the outer periphery thereof are arranged right above the LED so as to face each other. The conventional LED package suppresses an increase in luminance right above the LED by emitting light emitted from the LED in a direction substantially perpendicular to a package axis.

PRIOR ART DOCUMENT

Patent Document

[Patent document 1] Japanese patent laid-open No. 2003-8068

SUMMARY OF THE INVENTION

Problems to be Solved by the Invention

In the meantime, the above-mentioned conventional LED package described in Patent document 1 is configured such that light from the LED falling on the funnel-shaped portion or the sawtooth-shaped portion of the lens is reflected/refracted and is emitted parallel to an LED mounting surface. Therefore, a high-luminance portion and a low-luminance portion are generated in the lens arranged right above the LED, which causes luminance distribution unevenness, and it is not possible to completely suppress generation of luminance unevenness. Even if the funnel-shaped portion or an irregular shape of the sawtooth-shaped portion of the lens are designed using optical simulation, it is difficult to obtain the lens of the designed shape since the shape of the lens is complicated, and thus, there is a problem that it is difficult to accurately adjust light emission unevenness and also to obtain uniform luminance.

Therefore, the present invention was made to solve the above-mentioned conventional problem and a specific object of the invention is to provide a light source module that does not require accurate adjustment of the emission direction and can prevent unevenness in luminance.

Means for Solving the Problems

[1] According to a feature of the invention, a light source module comprises a light-emitting element and a light direction changing element for discharging in a lateral direction a light emitted from the light-emitting element, wherein the light direction changing element comprises a light-diffusing agent.

[2] In the invention described in the above [1], the light direction changing element comprises a light inputting surface through which the light emitted from the light-emitting element is inputted thereinto, a reflecting surface for reflecting the light inputted through the light inputting surface, and a light outputting surface for refracting the light reflected by the reflecting surface to emit in the lateral direction.

[3] In the invention described in the above [1] or [2], a holder piece is attached to the light direction changing element, wherein the holder piece comprises a housing portion opening toward the light direction changing element, and is adapted to hold a circuit board mounting the light-emitting element in the housing portion.

[4] In the invention described in any one of the above [1] to [3], the light direction changing element comprises a transparent material, and the light-diffusing agent is contained in an amount of not less than 0.01% by weight and not more than 0.1% by weight relative to 100% by weight of the transparent material.

Effects of the Invention

The invention allows increased light use efficiency and illumination light without unevenness in luminance, even when the emission direction is not accurately adjusted.

EXPLANATION OF REFERENCES

1 LIGHT SOURCE MODULE
2 ADVERTISING SIGN
3 ENCLOSURE
3a OPENING
3b BACK PLATE
3c SIDE PLATE

4 ADVERTISEMENT DISPLAY PORTION
4a ADVERTISING BOARD
4b TRANSPARENT PLATE
4c SCATTERING PLATE
5 PLANAR LIGHT-EMITTING DEVICE
6 MOUNTING UNIT,
7 REFLECTION PLATE
10 LIGHT DIRECTION CHANGING ELEMENT
11 CASE
11a FITTING RECESSED PORTION
11b NOTCH
11c SALIENT PORTION
12 LIGHT DIRECTION CHANGING PORTION
12a RECESSED PORTION
12b, 12c LIGHT INPUTTING SURFACE
12d LIGHT REFLECTING SURFACE
12e LIGHT OUTPUTTING SURFACE
13, 45 SEALING RESIN
14 LIGHT-DIFFUSING AGENT
20 HOLDER PIECE
21 HOUSING SPACE
22 LEVEL DIFFERENCE
30 CIRCUIT BOARD
31 ELECTRONIC COMPONENT
40 LED
41 RECESSED PORTION
41a INCLINED SURFACE
41b BOTTOM SURFACE
42 PACKAGE
43 LEAD
44 BLUE LED ELEMENT
46 PHOSPHOR
50 CABLE
G GAP
L1 to L3 LIGHT

[Preferred Embodiments for Carrying out the Invention]

Preferred embodiments of the present invention will be specifically described as below in conjunction with appended drawings.

[First Embodiment]

(Light Source Module)

In FIGS. 1A to 2B, the reference numeral 1 indicates the entire light source module and an exemplary structure thereof is schematically shown. As a basic structure, the light source module 1 is composed of a light direction changing element 10 for redirecting light toward the lateral direction, a holder piece 20 which is fitted into and fixed to the light direction changing element 10, a circuit board 30 held by and fixed to the holder piece 20, and a light-emitting element 40 (hereinafter, referred to as "LED 40") mounted on the circuit board 30. The LED 40 is electrically connected to a cable 50.

(Light Direction Changing Element)

The light direction changing element 10 of the light source module 1 has a rectangular case 11 and a circular light direction changing portion 12, as shown in FIGS. 1A to 2B. The case 11 and the light direction changing portion 12 are integrally formed by, e.g., injection molding of PMMA (polymethylmethacrylate) resin. The material of the light direction changing element 10 is not limited to the PMMA resin, and it is possible to use, e.g., a transparent resin such as polycarbonate, epoxy and silicone, transparent glass or various colored transparent materials.

(Case)

As shown in FIGS. 1A to 2B, the case 11 of the light direction changing element 10 has a rectangular fitting recessed portion 11a which opens on the lower surface. Two pairs of notches 11b, 11b are formed on sidewalls facing in a longitudinal direction and constituting the fitting recessed portion 11a, and two pairs of salient portions 11c, 11c are formed in a protruding manner on opposite sidewalls on the right and left sides of the longitudinal axis. The holder piece 20 is fitted into and fixed to the fitting recessed portion 11a of the case 11. An exposed portion enclosed by the light direction changing element 10 and the holder piece 20 is filled with a sealing resin 13. The cable 50 is inserted into the notch 11b of the case 11. The salient portion 11c of the case 11 is engaged with a mounting unit as a light source module mounting member of a non-illustrated counterpart device.

(Light Direction Changing Portion)

As shown in FIGS. 1A to 2B, the light direction changing portion 12 of the light direction changing element 10 is formed of a flat cylinder having a uniform outer diameter. The light direction changing portion 12 has a frustoconical shaped recessed portion 12a at a portion corresponding to the LED 40 mounted on the circuit board 30. The recessed portion 12a is composed of first and second light inputting surfaces 12b and 12c through which the light emitted from the LED 40 is inputted. The light direction changing portion 12 further includes a light reflecting surface 12d for reflecting the light inputted through the first light inputting surface 12b, and a light outputting surface 12e for refracting the light reflected by the light reflecting surface 12d to emit in the lateral, obliquely forward and obliquely backward directions. It is preferable that the light inputting surfaces 12b, 12c, the light reflecting surface 12d and the light outputting surface 12e be mirror-finished.

Figure 2A:
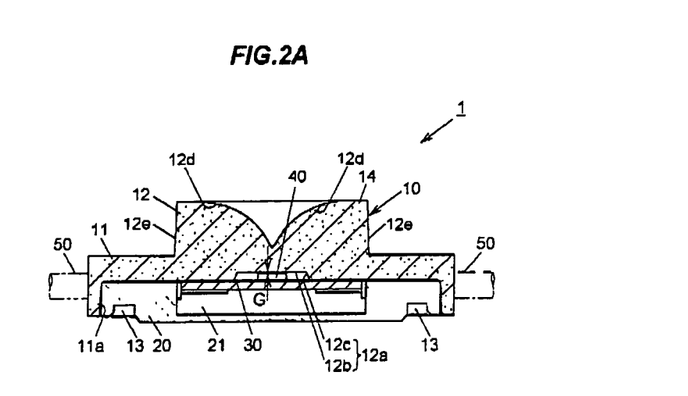
FIG. 2A is an enlarged cross sectional view taken in the direction of arrows IIA-IIA in FIG. 1B.

A gap G is formed between the first light inputting surface 12b and the LED 40, as shown in FIG. 2A. It is preferable that about 0.3 mm of the gap G be formed. As a result, any force is not applied to the LED 40 even when an external force is applied to the light direction changing element 10, hence, it is possible to prevent breakage, damage and abrasion, etc., of the LED 40. The light emitted from the LED 40 is also inputted to the second light inputting surface 12c of the light direction changing element 10. As a result, the light inputted to the second light inputting surface 12c is diffused, and it is thus possible to suppress luminance variation (contrasting unevenness).

As shown in FIGS. 1A to 2B, the light reflecting surface 12d of the light direction changing portion 12 is formed in a funnel shape which is gradually enlarged toward the light outputting surface 12e so as to totally reflect the light reaching from the first light inputting surface 12b toward the light outputting surface 12e. The form of the light reflecting surface 12d is not limited to the illustrated example. The light reflecting surface 12d may have an equivalent shape, e.g., a portion of a curved shape such as quadric of revolution, paraboloid of revolution or hyperboloid of revolution.

Although the light outputting surface 12e of the light direction changing portion 12 has a circular shape as shown in FIGS. 1A to 2B, the form of the light outputting surface 12e is not limited to the illustrated example, neither. The shape of the light outputting surface 12e may be, e.g., triangle, rectangular or a polyhedral shape such as octagon. It is also possible to enhance light diffusing properties of the light outputting surface 12e by roughening the outer surface thereof.

(Holder Piece)

The holder piece 20 of the light source module 1 is formed of, e.g., a resin material such as ABS resin. The holder piece 20 is formed of an elongated block plate as shown in FIGS. 1A to 2B even though it is not limited to the illustrated example. The housing space 21 which opens on the light direction changing element 10 side is formed inside the holder piece 20. A middle portion in the housing space 21 is formed in a stepped shape with a level difference 22 which has a supporting surface for placing and supporting the circuit board 30. A non-illustrated pin insertion hole is provided on the level difference 22 so as to vertically penetrate therethrough. A holder piece positioning pin (illustration omitted) of the light direction changing element 10 is inserted into the pin insertion hole. The holder piece 20 is fitted into and fixed to the fitting recessed portion 11a of the light direction changing element by adhesion or welding, etc.

(Circuit Board)

The circuit board 30 is formed of, e.g., a resin material such as a glass epoxy resin, but is not specifically limited thereto. The LED 40 is mounted on the surface of the circuit board 30 as shown in FIG. 2 and a non-illustrated wiring pattern is electrically connected to a lead of the LED 40. An electronic component 31 such as zener diode, etc., is mounted on the back surface of the circuit board 30. The electronic component 31 is housed in a housing space 21 of the holder piece 20 and is connected to a circuit board of another light source module 1 or a power source by the cable 50. By painting the surface of the circuit board 30 white, the light emitted from the LED 40 is diffusely reflected on the surface of the circuit board 30 and falls on the light direction changing element 10, thereby allowing illumination to be bright.

(LED)

Figure 3:
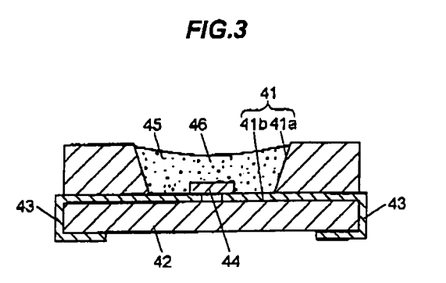
FIG. 3 is a schematic cross sectional view showing an LED shown in FIG. 2A.

Referring to FIG. 3, an exemplary structure of the LED 40 is schematically shown in FIG. 3. The LED 40 has a package 42 formed of a white resin material. The package 42 has a recessed portion 41 composed of an inclined surface 41a and a bottom surface 41b to be a reflector. A pair of leads 43, 43 extending to the outside and a blue LED element 44 which is electrically connected to the pair of leads 43, 43 at edges on the recessed portion 41 side and emits blue light are formed on the bottom surface of the recessed portion 41. The blue LED element 44 is mounted on the circuit board 30 via the leads 43.

The recessed portion 41 of the package 42 is filled with a sealing resin 45. The sealing resin 45 includes a phosphor 46 which is excited by the blue light emitted from the blue LED element 44 and emits yellow light. White light is emitted as a result of the combination of the blue light emitted from the blue LED element 44 and the yellow light emitted from the phosphor 46.

An LED element formed of, e.g., a GaN-based semiconductor compound in an emission wavelength range of 450 nm to 460 nm can be used as the blue LED element 44. As the phosphor 46, it is possible to use, e.g., a silicate-based phosphor or a garnet-based phosphor such as a YAG phosphor, etc. In an example of another LED, emission light of various colors can be obtained by combining, e.g., LED elements of three colors, R, G and B, instead of using the blue LED element 44.

(Light-Diffusing Agent)

Figure 1A:
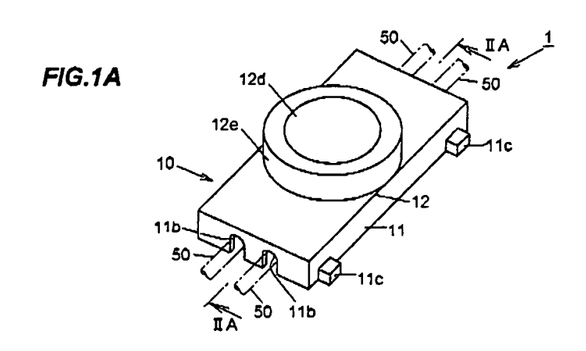
FIG. 1A is a schematic perspective view showing a light source module in a first preferred embodiment of the present invention.
Figure 1B:
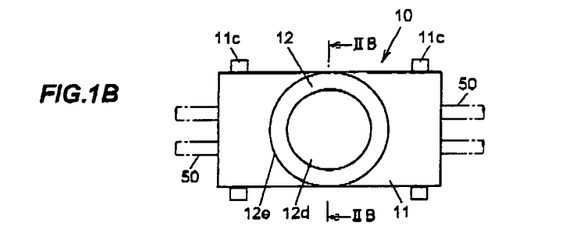
FIG. 1B is a plan view showing the light source module.
Figure 1C:
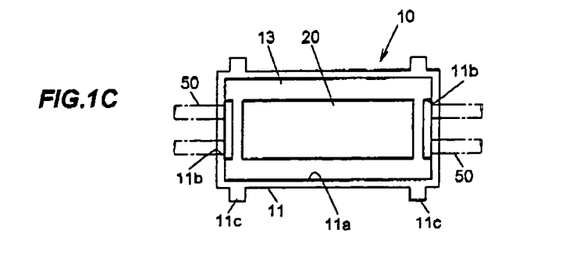
FIG. 1C is a bottom view showing the light source module.
Figure 2B:
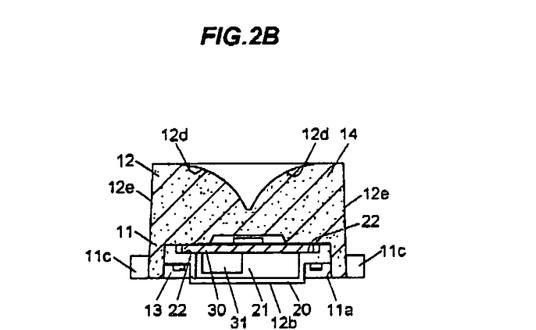
FIG. 2B is an enlarged cross sectional view taken in the direction of arrows IIB-IIB in FIG. 1A.

The light direction changing element 10 mixed with a particulate light-diffusing agent 14 having a different refractive index from that of a transparent material as a constituent element as shown in FIGS. 1 and 2 is preferably used. The light-diffusing agent 14 is not specifically limited as long as the particle has a property to diffuse light. As the light-diffusing agent 14, for example, inorganic particles such as glass beads, silica particles, aluminum hydroxide particles, calcium carbonate particles or titanium oxide particles, etc., or organic particles such as styrene resin particles, acrylic resin particles or silicone particles, etc., are used, and one thereamong or two or more thereamong are compounded with the transparent resin of the light direction changing element 10.

The shape of the light-diffusing agent 14 is not limited, and it is possible to use various shapes such as, e.g., cubic shape, a needle shape or a plate shape, etc. Preferably and desirably, the light-diffusing agent 14 is in a spherical shape which can diffuse the light isotropically. The average particle size of the light-diffusing agent 14 is desirably in a range of, e.g., about 0.5 to 10 μm since it is possible to uniformly diffuse the light. The average particle size of less than about 0.5 μm is not preferable since light permeability decreases even though the light diffusing properties are enhanced. On the other hand, the average particle size of more than about 10 μm is not preferable since luminance unevenness is likely to occur due to the decrease in the light diffusing properties even though light permeability increases.

The content of the light-diffusing agent 14 can be appropriately selected depending on the type of resin, thickness and outer shape of the light direction changing element 10. In the first embodiment, the light direction changing element 10 is used in a state that the light-diffusing agent 14 is mixed to provide light-milky white color and is uniformly dispersed in the transparent resin. The amount of the light-diffusing agent 14 dispersed in the transparent resin is preferably not less than 0.01% by weight and not more than 0.1% by weight per 100% by weight of the transparent resin. It is preferable and specifically desirable that the light-diffusing agent 14 is contained in an amount of about 0.05% by weight per 100% by weight of the transparent resin. The content of the light-diffusing agent 14 of more than 0.1% by weight is not preferable since mechanical strength of the light direction changing element 10 is degraded. On the other hand, the content of light-diffusing agent 14 of less than 0.01% by weight is not preferable since a light diffusing effect is not obtained, and further, dark and bright portions of the light are scattered on the light reflecting surface 12d of the light direction changing element 10.

Figure 4:
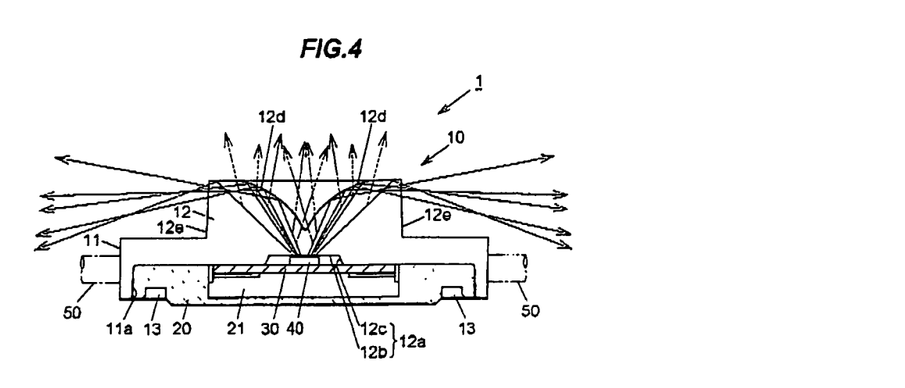
FIG. 4 is an explanatory diagram illustrating lights outputted from the light source module shown in FIG. 2A.

Light beams whose emission direction is changed by the light direction changing element 10 are schematically shown in FIG. 4. By adjusting the amount of the light-diffusing agent 14 added per 100% by weight of the transparent resin to be within a range of not less than 0.01% by weight and not more than 0.1% by weight, the light emitted from the LED 40 is adequately diffused in multiple directions in the light direction changing element 10, and the light transmitted from the back side to the front side of the light reflecting surface 12d of the light direction changing element 10 is substantially uniformly diffused and emitted. As a result, it is possible to eliminate unevenness in light intensity caused by a shape of or strain in the light direction changing element 10.

(Effects of the First Embodiment)

The following various effects are obtained by the light source module 1 in the first embodiment.

(1) It is possible to easily change directivity of the light outputted from the light direction changing element 10 to the light reflecting surface 12d by adjusting the amount of the light-diffusing agent 14 contained per 100% by weight of the transparent resin to be within a range of not less than 0.01% by weight and not more than 0.1% by weight.

(2) Conventionally, there is a problem in that unevenness in color and luminescence is generated since light from an LED is dispersed due to lens properties such as shape or thickness of a lens formed of a transparent material. In the first embodiment, it is possible to easily change the light path by mixing not less than 0.01% by weight and not more than 0.1% by weight of the light-diffusing agent 14 in the light direction changing element 10 formed of the transparent material, which allows the light from the light source module 1 to be uniformly dispersed without accurately adjusting the emission direction, hence, an effect of optical uniformity is obtained.

(3) Since it is possible to redirect the light inputted to the light inputting surfaces 12b and 12c of the light direction changing element 10 to allow the light to emit in the lateral, obliquely forward and obliquely backward directions, the irradiation area of one LED 40 is increased and it is thus possible to sufficiently suppress unevenness in color and luminescence.

(4) Since the gap G is provided between the recessed portion 12a of the light direction changing element 10 and the LED 40, an external force is not applied to the LED 40 even if pressure is applied to the light direction changing element 10, and it is thus possible to prevent breakage, damage and abrasion, etc., of the LED 40 from occurring.

[Second Embodiment]
(Planar Light-Emitting Device)

The finished product of the light source module 1 configured as described above can be effectively used for a mounting unit mounting plural arrayed light source modules 1 on a mounting surface thereof and for a planar light-emitting device (a backlight device) using thereof, etc., as described in JP-A 2007-48883 and JP-A 2008-159394 which have been previously proposed by the applicant.

Figure 5:
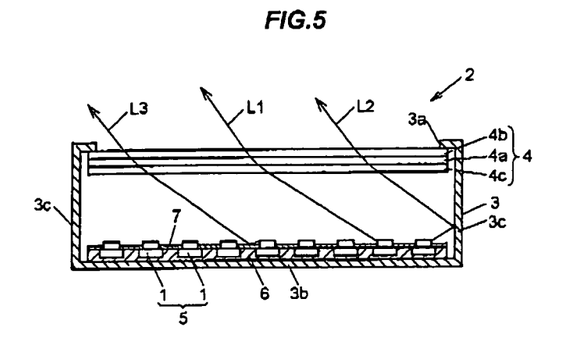
FIG. 5 is an explanatory diagram illustrating lights outputted from a planar light-emitting device in a second embodiment using the light source module shown in FIG. 1A.

Referring to FIG. 5, a planar light-emitting device 5 using the light source module 1 of the first embodiment is schematically shown in FIG. 5. It should be noted that members substantially the same as those in the first embodiment are denoted by the same names and reference numerals. Therefore, detailed descriptions for the members substantially the same as those in the first embodiment will be omitted.

The entire advertising sign using the light source module 1, which is indicated by the reference numeral 2, is schematically shown in FIG. 5. The advertising sign 2 is provided with a rectangular enclosure 3 having an opening 3a, an advertisement display portion 4 provided in the opening 3a and a planar light-emitting device 5 attached to a back plate 3b of the enclosure 3. Illumination light is emitted from the back side to the front side of the advertisement display portion 4 by the planar light-emitting device 5.

The enclosure 3 of the advertising sign 2 is formed of a metal material or a resin material such as polycarbonate, etc., and is provided with four side plates 3c which surround the back plate 3b. A metal sheet such as an aluminum sheet, etc., is attached to the inner surfaces of the side plates 3c to increase light reflection efficiency. A white paint may be applied to the inner surfaces of the side plates 3c instead of using the metal sheet, or the enclosure 3 can be formed of a white resin material.

The advertisement display portion 4 of the advertising sign 2 is formed by stacking an advertising board 4a, a transparent plate 4b and a scattering plate 4c, however, it is not limited thereto. The transparent plate 4b and the scattering plate 4c are formed of a transparent resin or transparent glass, etc. The transparent plate 4b protects the advertising board 4a having an advertisement printed thereon. The scattering plate 4c has fine unevenness on front and back surfaces to scatter the incident light.

The planar light-emitting device 5 of the advertising sign 2 is provided with a mounting unit 6 attached to the back plate 3b, plural light source modules 1 removably fitted to the mounting unit 6, and a reflection plate 7 arranged on the case 11 of the light source module 1. The light emitted obliquely backward from the light source module 1 and the light emitted from the light source module 1 and then reflected at the advertisement display portion 4 are reflected by the reflection plate 7 toward the advertisement display portion 4. The reflection plate 7 which is formed of, e.g., a resin material such as ABS resin, etc, and has a reflecting surface formed by applying a white paint to the surface on the advertisement display portion 4 side can be used, and alternatively, the reflection plate 7 can be formed of a white resin material.

If the power is supplied to the planar light-emitting device 5 at this point, white light is emitted from the LEDs 40 of the plural light source modules 1. The white light is adequately diffused by the light direction changing element 10 toward lateral, obliquely upward and obliquely downward directions as shown in FIG. 4, and the light transmitted from the back side to the front side of the light reflecting surface 12d of the light direction changing element 10 is substantially uniformly diffused and emitted. A light L1 emitted obliquely forward from the light source module 1 directly reaches the advertisement display portion 4, as shown in FIG. 5. A light L2 emitted obliquely forward as well as laterally reaches the advertisement display portion 4 after being reflected by the inner surface of the side plate 3c of the enclosure 3. A light L3 emitted obliquely backward reaches the advertisement display portion 4 after being reflected by the reflection plate 7 to clearly display the contents of an advertisement on the advertising board 4a.

(Light-Diffusing Agent)

The content of the light-diffusing agent 14 of less than 0.01% by weight per 100% by weight of the transparent resin of the light direction changing element 10 makes the center portion of the light source module 1 dark and a portion between the adjacent light source modules 1 bright, hence, dark and bright portions (light unevenness) are scattered on the advertisement display portion 4 and the luminance distribution of the advertisement display portion 4 becomes non-uniform. On the other hand, when the content of the light-diffusing agent 14 is more than 0.1% by weight, the portion between the adjacent light source modules 1 becomes dark even though a portion right above the light source module 1 is bright, hence, dark and bright portions are scattered on the advertisement display portion 4.

If a light transmissive surface and a total reflection surface are formed in the light reflecting surface 12d of the light direction changing element 10 instead of adding the light-diffusing agent 14 to the light direction changing element 10, dark and bright portions are scattered on the advertisement display portion 4 due to strong straightness of the LED 40, therefore, it is not preferable. If a textured surface on which surface texturing is performed is formed on the light reflecting surface 12d of the light direction changing element 10, luminance unevenness is less remarkable since the light inputted to the textured surface is diffusely reflected. However, it is not preferable since it is necessary to test the shape, size and layout position of the textured surface and to accurately adjust the amount of the light transmitted from the back side toward the front side of the light reflecting surface 12d of the light direction changing element 10.

In the second embodiment, since the content of the light-diffusing agent 14 is adjusted to about 0.05% by weight per 100% by weight of the transparent material of the light direction changing element 10, the light emitted from the LED 40 of the light source module 1 is totally reflected, transmitted and refracted by the light direction changing element 10 and is randomly reflected and diffused in multiple directions by the light-diffusing agent 14 which is mixed to the light direction changing element 10. Each light from the LEDs 40 of the plural light source modules 1 falls on a rear surface of the advertisement display portion 4 after being reflected by the inner surface of the enclosure 3 of the advertising sign 2, etc., without generating a difference in brightness in the portion right above the light source module 1 and in the portion between the adjacent light source modules 1. As a result, a backlight device with less luminance unevenness in the light direction changing element 10 is obtained.

(Effect of the Second Embodiment)

The following effects are obtained by the planar light-emitting device 5 of the second embodiment, in addition to the effects of the first embodiment.

(1) An adjustment of the light outputted from the portion right above the light source module 1 is facilitated by mixing the light-diffusing agent 14 and using the diffused reflection light, and it is possible to surely eliminate the difference in brightness in the portion right above the light source module 1 and the portion between the plural light source modules 1.

(2) Since the light direction changing element 10 uses relatively few LEDs 40 and each LED 40 can be separately mounted on the circuit board 30 with a simple configuration, it is possible to improve productivity.

As is obvious from the above description, the present invention is not intended to be limited to the above-mentioned embodiments, modifications and illustrated examples, and various changes in design can be made without departing from the scope of each claim. Although the case where the planar light-emitting device is used as a backlight of an advertising sign has been described in the second embodiment, it is obvious that it is not limited thereto. It is possible to effectively use for, e.g., a liquid crystal television or a graphic display device for displaying an image on a planar light-emitting device itself by turning on and off a light source module in accordance with an image signal.

The invention claimed is:

1. A light source module, comprising:
    a light-emitting element;
    a light direction changing element for discharging in a lateral direction a light emitted from the light-emitting element; and
    a holder piece formed in a fitting recessed portion of the light direction changing element,
    wherein the light direction changing element comprises:
        a light inputting surface through which the light emitted from the light-emitting element is inputted thereinto;
        a reflecting surface intersecting with an optical axis of the light-emitting element for reflecting the light inputted through the light inputting surface; and
        a light-diffusing agent of not less than 0.01% by weight and not more than 0.1% by weight so as to uniformly diffuse and emit a light transmitted through a back side to a front side of the reflecting surface; and
    wherein the reflecting surface comprises a first portion which is gradually enlarged, and a second portion which is formed at an upper end of the first portion and is substantially parallel to the light inputting surface and reflects the light inputted through the light inputted surface in a downward lateral direction,
    wherein the holder piece comprises a housing portion opening toward the light direction changing element, and is adapted to hold a circuit board mounting the light-emitting element in the housing portion;
    wherein the light-emitting element is mounted on a mounting surface of the circuit board; and
    wherein the holder piece is placed such that the mounting surface forms substantially the same face with an upper surface of the holder piece.

2. The light source module according to claim 1, wherein the light direction changing element further comprises a light outputting surface for refracting the light reflected by the reflecting surface to emit in the lateral direction.

3. The light source module according to claim 1, wherein the light-emitting element comprises a light-emitting diode (LED).

4. The light source module according to claim 1, wherein the light-diffusing agent comprises one of glass beads, silica particles, aluminum hydroxide particles, calcium carbonate particles and titanium oxide particles, styrene resin particles, acrylic resin particles and silicone particles.

5. The light source module according to claim 1, wherein an average particle size of the light-diffusing agent is in a range from 0.5 μm to 10 μm.

6. The light source module according to claim 1, wherein the light direction changing element further comprises:
    a case; and
    a light direction changing portion formed on the case and including the light inputting surface, the reflecting surface, and a light outputting surface for refracting the light reflected by the reflecting surface to emit in the lateral direction.

7. The light source module according to claim 6, wherein the light direction changing portion and the case are integrally formed from a molded resin, and the light-diffusing agent is dispersed throughout the molded resin in the case and the light direction changing portion.

8. The light source module according to claim 6, wherein the light direction changing portion comprises a recessed portion including the light inputting surface, the light-emitting element being formed in the recessed portion of the light direction changing portion and emitting light through the recessed portion to the reflecting surface.

9. The light source module according to claim 6, wherein the light inputting surface, the light reflecting surface and the light outputting surface comprise a mirror-finished surface.

10. The light source module according to claim 6, wherein light outputting surface comprises a side surface of the light direction changing portion, and the light reflecting surface comprises a funnel shape which is gradually enlarged toward the light outputting surface.

11. The light source module according to claim 2, wherein the first portion of the reflecting surface is gradually enlarged in a direction toward the light outputting surface.

* * * * *